(12) United States Patent
Kluge et al.

(10) Patent No.: US 11,137,468 B2
(45) Date of Patent: Oct. 5, 2021

(54) METHOD AND MAGNETIC RESONANCE APPARATUS FOR ACQUIRING A MAGNETIC RESONANCE DATASET WITH CORRECTION OF GRADIENT IMPULSE RESPONSE FUNCTIONS

(71) Applicant: Siemens Healthcare GmbH, Erlangen (DE)

(72) Inventors: Thomas Kluge, Hirschaid (DE); David Grodzki, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 542 days.

(21) Appl. No.: 15/976,051

(22) Filed: May 10, 2018

(65) Prior Publication Data
US 2018/0329010 A1    Nov. 15, 2018

(30) Foreign Application Priority Data
May 10, 2017  (DE) .......................... 102017207904.5

(51) Int. Cl.
*G01R 33/565* (2006.01)
*G01R 33/56* (2006.01)

(52) U.S. Cl.
CPC ... *G01R 33/56572* (2013.01); *G01R 33/5608* (2013.01)

(58) Field of Classification Search
CPC .......... G01R 33/5608; G01R 33/56572; G01R 33/3852; G01R 33/56509
See application file for complete search history.

(56) References Cited

U.S. PATENT DOCUMENTS

| | | | |
|---|---|---|---|
| 9,945,920 B2* | 4/2018 | Grodzki | G01R 33/543 |
| 2013/0234708 A1* | 9/2013 | Goora | G01R 33/56572 324/309 |
| 2014/0232396 A1 | 8/2014 | Grodzki et al. | |
| 2015/0253405 A1 | 9/2015 | Grodzki et al. | |
| 2018/0292502 A1* | 10/2018 | Atalar | G01R 33/072 |
| 2019/0250237 A1* | 8/2019 | Boernert | G01R 33/3852 |

OTHER PUBLICATIONS

Tang, Weinan, and Weimin Wang. "Highly integrated gradient pulse generator for magnetic resonance imaging system." Concepts in Magnetic Resonance Part B: Magnetic Resonance Engineering 39.2 (2011): 59-63. (Year: 2011).*

(Continued)

*Primary Examiner* — Rishi R Patel
(74) *Attorney, Agent, or Firm* — Schiff Hardin LLP

(57) ABSTRACT

In a method and magnetic resonance imaging apparatus having a scanner that for acquires a magnetic resonance dataset, a magnetic resonance sequence is provided to a computer and is converted in the computer into a digital sequence execution signal that includes a target gradient waveform in the form of a time-discrete target gradient signal the computer calculates a pre-GIRF gradient signal by applying a digital pre-emphasis filter to the target gradient signal. The computer transmits the pre-GIRF gradient signal to the magnetic resonance system scanner and) the scanner executes the digital sequence execution signal containing the pre-GIRF gradient signal in order to acquire magnetic resonance raw data.

19 Claims, 6 Drawing Sheets

(56) References Cited

OTHER PUBLICATIONS

Goora, Frédéric G., Bruce G. Colpitts, and Bruce J. Balcom. "Arbitrary magnetic field gradient waveform correction using an impulse response based pre-equalization technique." Journal of Magnetic Resonance 238 (2014): 70-76. Provided by sciencedirect.com (Year: 2014).*

Campbell-Washburn et al.: "Real-time distortion correction of spiral and echo planar images using the gradient system impulse response function"; Magn. Reson. Med. Jun. 2016; vol. 75 No. 6, pp. 1-17; (2016).

Vannesjö, "Characterizing and Correcting for Imperfect Field Dynamics in Magnetic Resonance Imaging"; Doctoral Dissertation; Royal Institute of Technology, Stockholm, Sweden; (2013).

Vannesjo et al: "Gradient System Characterization by Impulse Response Measurements with a Dynamic Field Camera", Magnetic Resonance in Medicine, vol. 69, pp. 583-593, (2013).

Vannesjo, Johanna S. et al.; "Image Reconstruction Using a Gradient Impulse Response Model for Trajectory Prediction"; Magnetic Resonance in Medicine; vol. 76; pp. 45-58; (2016).

Goora. et al: "Arbitrary magnetic field gradient waveform correction using an impulse response based pre-equalization technique"; Journal of Magnetic Resonance 2014; vol. 238; pp. 70-76; (2014).

\* cited by examiner

METHOD AND MAGNETIC RESONANCE APPARATUS FOR ACQUIRING A MAGNETIC RESONANCE DATASET WITH CORRECTION OF GRADIENT IMPULSE RESPONSE FUNCTIONS

BACKGROUND OF THE INVENTION

Field of the Invention

The present invention relates to magnetic resonance imaging, and in particular to the acquisition of magnetic resonance data with the implementation of at least a partial correction of gradient impulse response functions (GIRFs).

Description of the Prior Art

In magnetic resonance imaging (MRI), gradient fields are needed for spatial resolution of the measured MR signals. In clinical MRI this is generally done by generating linear gradient fields along the orthogonal axes x, y, and z, where the z-direction usually points in the direction of the basic magnetic field. The gradient fields are produced using three gradient coils, which generate a field in the x-direction, y-direction and z-direction, respectively.

In order to allow the imaging slices or imaging volumes to be positioned freely, the gradient fields of the three gradient coils are combined with one another, or superimposed on one another, so that the readout, phase and slice directions can be positioned independently of the x-, y- and z-directions. This means that whenever a gradient field is switched (activated) in an MR data acquisition sequence, in reality at least two, or all three, gradient coils are involved in generating the gradient field.

As a result of the high currents in the gradient coil, effects such as eddy currents, higher-order fields or even magnetic field components in the x- and y-directions, can occur which may impair the data acquisition. These effects are taken into account when designing the gradient coils and in the sequence settings and protocol settings, and therefore usually do not affect the clinical diagnosis significantly.

Another factor that has received little attention in MRI until recently is the effect of system-specific "Gradient Impulse Response Functions" (GIRFs). These concern interactions between the individual gradient fields generated by the respective gradient coils. In other words, GIRFs describe the effect on one another of the respective gradients on the different gradient axes, for instance when a gradient produced along a first axis affects the gradient waveforms of at least one other axis. The origins of this effect lie in the coil geometry, which results in mutually inductive interference between the coils, and in the electronic signal paths.

This means that the system does not reproduce a first gradient waveform, which was defined by the sequence developer for a particular encoding, but instead produces a second gradient waveform, which may deviate from the first gradient waveform. This can result in incorrect encodings or other effects, which cause artifacts or degradation of image quality.

With uniform Cartesian sampling of k-space, the outcome of the effects of GIRFs is typically minor moment errors, which do not depend on the k-space position and leave a small linear phase in the image. For rapid "single-shot" and/or non-Cartesian k-space trajectories (spiral, EPI, radial), the trajectory errors depend on the k-space position and result in significant artifacts.

This effect is referred to below as a GIRF-based error or GIRF-induced gradient impairment.

Research is currently being carried out into correcting this problem. In a technique known as the GIRF method, as defined by Signe Johanna Vannesjö, the gradient system is described as a linear time-invariant (LTI) system. This allows the actually implemented gradient waveform to be predicted by convolution of the gradient waveform defined by the sequence developer with the GIRFs.

The dissertation by Signe Johanna Vannesjö, "Characterizing and Correcting for Imperfect Field Dynamics in Magnetic Resonance Imaging", DISS. ETH NO. 21558, 2013 explains how the GIRF can be used for pre-emphasis of the programmed gradient waveforms so that the cross-terms disappear from the waveforms that are actually output. It is not possible, however, to avoid the low-pass characteristic of the gradient system.

This currently works only "offline", however, by importing a desired gradient waveform of a protocol into a computer, calculating a corrected waveform in the computer, and passing this to the scanner.

In detail, Vannesjö et al, "Image Reconstruction Using a Gradient Impulse Response Model for Trajectory Prediction", Magnetic Resonance in Medicine 76:45-58 (2016) specifies that the GIRF-based errors can be obtained from measurements using the following equation:

$$GIRF_{l,m}(\omega) = \frac{\sum_j I_{l,j}^*(\omega) \cdot O_{l,m,j}^{(meas)}(\omega)}{\sum_j |I_{l,j}(\omega)|^2}$$

where
l=x, y, z denotes the gradient axis,
m=0, x, y, z denotes the output field, and
j=1, 2, 3, ... denotes the input pulse,
$O_{l,m,j}^{(meas)}(\omega)$ denotes the measured field values, and
$I_{l,j}(\omega)$ denotes the input values.

The measurements of the gradient field values can be performed as specified in Vannesjö et al, Gradient System Characterization by Impulse Response Measurements with a Dynamic Field Camera, Magnetic Resonance in Medicine 69:583-593 (2013).

On the basis of the measured GIRF-based errors, it is possible to determine a gradient value $O_m^{(pred)}(\omega)$ taking into account the errors:

$$O_m^{(pred)}(\omega) = \sum_j I_{l,j}(\omega) \cdot GIRF_{l,m}(\omega)$$

Using this equation, the GIRF effect can be taken into account in assigning gradient field values to the applied control signals.

In this process, the gradient fields are considered to be linear and time-invariant (LTI) fields.

One problem with this correction of the GIRF-based errors is that it only works "offline", i.e. before a correction is made, all gradient control signals, i.e. the entire sequence execution signal, must be known in order to be able to apply a correction to this signal. The time-based gradient control signals must be Fourier-transformed into the frequency domain, in order then to be transformed back into the time domain after correction, which corresponds to convolution in the time domain. It is therefore not possible to use a real-time sequence that is adapted during the MR raw data acquisition, e.g. adapted to a movement of the patient.

SUMMARY OF THE INVENTION

Proceeding from the above explanation, an object of the present invention is to define a method for acquiring a magnetic resonance dataset in which GIRF-induced gradient errors are corrected. In particular, an object is to define an automated and computationally efficient method for correcting GIRF-induced gradient errors.

In the method according to the invention for acquiring a magnetic resonance dataset, a magnetic resonance sequence, also called a pulse sequence, is first provided to a computer. The magnetic resonance sequence includes a definition of a succession of radio-frequency pulses, for instance excitation pulses and refocusing pulses, as well as gradient pulses along different gradient axes in the different spatial directions, which gradient pulses are intended to be emitted in coordination with the radio-frequency pulses. Readout windows, in which the induced magnetic resonance signals (raw data) are detected, are set at times to fit this sequence.

A magnetic resonance signal is typically programmed in a generalized form which is then adapted to suit the specific measurement, for instance the actually selected slice thickness and the spatial orientation of the slices. For example, the programmed magnetic resonance sequence defines gradient pulses in the readout, phase and slice directions, which pulses must be converted into gradient pulses in the x-, y- and z-directions on the basis of the defined spatial orientation of the slices. Thus a magnetic resonance sequence is not yet directly suitable for controlling a magnetic resonance scanner, but must first be converted into a signal that is designated in this application as a sequence execution signal. Only the digital sequence execution signal includes the control signals that can be transmitted directly to the magnetic resonance scanner so as to then control a radio-frequency antenna for emitting the individual radio-frequency pulses and a gradient arrangement containing the gradient coils for emitting the individual gradient pulses.

To facilitate this process in accordance with the invention, a magnetic resonance sequence and/or the sequence execution signal generated therefrom is divided into individual event blocks. The end of one event block in the magnetic resonance sequence indicates to the controller of the magnetic resonance scanner that the sequence execution signal calculated or converted up to this point in time is now final and ready for emission, i.e. program elements of the magnetic resonance sequence that lie in the future can have no further effect on the sequence execution signal. Thus each event block is processed one after the preceding event block, and the corresponding sequence execution signals are then transmitted to the scanner, event block-by-event block.

According to the invention, the GIRF correction is not applied to the magnetic resonance sequence or the sequence code in advance, but is applied only after the magnetic resonance sequence has been converted into a digital sequence execution signal. The sequence execution signal contains a time-discrete target gradient signal, i.e. a digital succession of sample points, which define the target gradient waveform for the x-, y- and/or z-gradient coil and are suitable for controlling the gradient unit directly. A digital pre-emphasis filter is applied to this target gradient signal that modifies the signal and converts it into a pre-GIRF gradient signal.

This is preferably done "on the fly" to respective short time windows of the target gradient signal. In this process, each sample point of the target gradient signal is fed into the digital filter continuously. For each fed-in sample point of the target gradient signal, a filtered sample point of the pre-GIRF gradient signal is emitted as an output, with a fixed number of sample points being processed at a time. The time window over which the digital filter acts is preferably so short that the correction takes place practically in real time. Thus the magnetic resonance sequence can be adapted while the magnetic resonance dataset is still being acquired, as is required for real-time sequences. For instance during such sequences, patient movements are detected and the slices repositioned. The movement may be, for instance, a respiratory movement or the beating of the heart.

An advantage of the invention is therefore that the sequence can respond in real time. Moreover, a digital filter such as the pre-emphasis filter can be implemented very efficiently computationally.

The pre-GIRF gradient signal is preferably pre-emphasized such that the actual gradient waveform actually generated in the magnetic resonance system during the acquisition comes closer to the target gradient waveform than if the target gradient signal (i.e. without the digital pre-emphasis filter) were to have been executed directly. The gradient signal is thus modified by the pre-emphasis filter such that GIRF-induced gradient impairments are reduced or even removed. The pre-GIRF gradient signal actually executed is thus preferably pre-emphasized such that the effects defined by the system-specific "gradient impulse response functions" are corrected at least in part.

Another advantage of the method according to the invention is that for any measurement, entirely regardless of the sequence, switching for this sequence can be performed without the need for any interventions in the sequence code itself. This means that the method can run fully automatically and invisibly not only for the user, but also for the sequence developer. In addition, further additional optimization steps can be added, as described later.

The design of the digital pre-emphasis filter preferably makes use of the knowledge from the cited prior art disclosed by Signe Johanna Vannesjö. The method according to the invention differs from the known prior art, however, because in the inventive method it is not necessary to know the entire sequence, but just the length of the time window of the pre-emphasis filter. Inherently this results in an approximation rather than an exact mathematical solution, with the advantage that the method according to the invention can be performed automatically and "on the fly".

Since the GIRF-induced gradient impairments are system-specific, the pre-emphasis filter is pre-configured once for each device type or for each device. A heuristic approach or a linear optimization system can be used, for instance, for the design of the pre-emphasis filter.

Using the pre-emphasis filter, instead of having to perform a Fourier transform on the gradient waveform to facilitate a correction, the digital pre-emphasis filter according to the invention is applied to the target gradient signal in the time domain. In other words, the gradient signal is processed in the time domain and is not Fourier-transformed into the frequency domain.

The length of the pre-emphasis filter (i.e. the length of the time window) is preferably selected such that the control unit can still keep pace in real time. The length selection must take into account, however, that the frequency resolution is higher for a longer time window. The digital pre-emphasis filter is thus preferably not longer than 10 ms. Preferably the pre-emphasis filter is applied to a signal length of 0.2 to 10 ms, more preferably 0.5 to 5 ms, even more preferably 1 to 3 ms. In other words, the digital filter processes each of the sample points of the target gradient signal in this time window, with the sample points being fed into the filter one after the other, and one corrected sample point (i.e. one point of the pre-GIRF gradient signal) being output after the other. This results in the requirement that the digital pre-emphasis filter must use less time to calculate a single point than the time resolution (dwell time) of the target gradient signal. The target gradient signal is specifically part of the sequence execution signal transmitted directly to the magnetic resonance system and thus used directly for controlling the gradient unit. A delay is therefore no longer possible at this point in time. Thus the processing time for each individual output value of the pre-GIRF gradient signal is advantageously shorter than the time resolution of the target gradient signal, in particular 5 to 10 times shorter. Overall, the digital pre-emphasis filter produces e.g. a total delay of 0.2 to 10 ms, preferably 0.5 to 5 ms.

The digital pre-emphasis filter is preferably designed such that mechanical resonances, the cross-terms (i.e. the interaction between the individual gradients in the x-, y- and z-directions) and higher-order gradient errors are corrected or corrected at least in part. The only thing that the filter cannot correct is an inherent low-pass filter that automatically arises when a magnetic resonance system executes a digital sequence execution signal containing a gradient signal, i.e. the actual gradient waveform no longer contains the high frequencies compared with the target gradient waveform.

The method in DE 10 2014 203 867 A1/B4, for instance, is eligible as additional optimization steps. The content of that document and the corresponding U.S. Pat. No. 9,945,920 are incorporated herein by reference.

The method described in those documents likewise concerns optimizing a magnetic resonance sequence. The method presented in DE 10 2014 203 867 A1 is able to intercept a sequence waveform transmitted to the magnetic resonance system for execution, optimize that waveform, and transfer the waveform in optimized form to the magnetic resonance scanner. Defining optimizable regions in which the gradient waveforms are replaced e.g. entirely by spline curves, which leave unchanged only the start point, end point and gradient moment, facilitates measurements that are particularly "soft on gradients" and therefore quiet.

In a preferred variant, at least one gradient pulse is optimized for noise reduction. Again in this case the optimization is performed on the emission-ready sequence execution signals. In this process, at least one gradient pulse occurring during at least one variable time interval is optimized automatically, with the automatic optimization taking into account the first moment of the at least one gradient pulse. The zeroth moment is the integral of the gradient amplitude over the time length of the gradient pulse, and defines the spatial encoding. The first gradient moment is defined as the integral over the amplitude of the gradient pulse multiplied by the time, integrated over the time length of the gradient pulse, and in some sequences is relevant to flow encoding. Thus the method given in DE 10 2014 203 867 B4 optimizes gradient pulses taking into account their gradient moments.

Preferably, the gradient pulses are "smoothed" in the process, i.e. where the timing of the sequence allows. This means the "corners" of the gradient shape of the gradient pulses are rounded off, without changing the zeroth gradient moment (i.e. the area under the gradient shape). Especially for phase-gradient pulses, the same effect can be achieved in a softer manner. Gradient pulses during which a radio-frequency pulse is meant to be emitted or measurement data is meant to be read out are preferably omitted from the smoothing, however, because it is not sufficient for these gradients if only the zeroth gradient moment stays constant.

This method can advantageously be combined with the present invention by applying the two optimization steps preferably one after the other to the digital sequence execution signal.

In this case, the digital pre-emphasis filter can be applied before or after the gradient optimization known from DE 10 2014 203 867 B4 (referred to below as "gradient optimization"). If the gradient optimization is applied first to the target gradient signal, the shapes of the gradient pulses are thereby rounded off without changing the area, with the result that the gradient pulses have fewer edges. The output from the gradient optimization is thus an optimized target gradient signal, again in the form of, or part of, a digital sequence execution signal that is suitable for being fed directly into the magnetic resonance system for execution. Before this is done, however, the digital pre-emphasis filter is then still applied to the signal. Both optimization steps are performed for each individual implemented event block. The delay of each individual optimization step advantageously lies in the region of milliseconds, altogether preferably less than 15 ms, preferably less than 10 ms, so that the magnetic resonance sequence can still respond in real time. The aforementioned time constraints of the control unit still being able to keep pace in real time and of the digital pre-emphasis filter having to use less time to calculate a single point than the time resolution (dwell time) of the target gradient signal, also apply to the combination of the two methods (gradient optimization and digital pre-emphasis filter).

In a preferred embodiment, the digital pre-emphasis filter and the gradient optimization are harmonized with one another such that the design of the gradient optimization process takes into account the knowledge about the system-specific "gradient impulse response functions" obtained during the configuration of the digital pre-emphasis filter, in particular knowledge about system-specific resonant frequencies. For instance, the GIRF-induced gradient impairments are analyzed in order to make the design of the gradient optimization more effective. For example, within the GIRF-based errors, resonances that infer a loud noise are found at certain frequencies. Then precisely these frequencies can be filtered out more strongly in the design of the gradient optimization.

According to a preferred embodiment, the method according to the invention is performed as follows, for instance:

A magnetic resonance sequence is provided that was defined e.g. on the basis of protocol parameters in a known manner, for instance using the IDEA sequence development environment. This sequence is converted into a digital sequence execution signal for the acquisition. This sequence execution signal corresponds in general to an optimum waveform. The sequence execution signal also contains the target gradient signals, which exhibit the optimum waveform. This sequence execution signal is then output, event block by event block.

According to a preferred embodiment, the target gradient signal is now intercepted and, in a preferred embodiment, the aforementioned gradient-optimization process for noise reduction is immediately applied. Then the gradient signal is buffered, in particular it is buffered, or stored temporarily, in a rolling manner before, or while, the digital pre-emphasis filter is applied. "Rolling" means that only the signal length needed for the pre-emphasis filter is ever stored, and thus the memory contents are constantly refreshed. The buffer may be part of, or else separate from, the pre-emphasis filter. An algorithm is now used by the digital pre-emphasis filter to calculate new gradient waveforms, which are in a form such that after the influence of the expected GIRF effects, they correspond to the target gradient waveform. These calculated gradient waveforms are called the pre-GIRF gradient signal.

The pre-GIRF gradient signals calculated in this manner are transmitted to the magnetic resonance system, and the instructions contained therein are executed.

In order for the digital filter to be able to start its work immediately at the beginning of an event block, the contents of the buffer are passed to the next event block at the end of each event block in order to calculate the pre-GIRF gradient signal. In other words, the filter history, i.e. the sample points of the gradient signal which have not yet completed processing and have not yet been emitted as an output, are passed from event block to event block.

The invention also relates to a magnetic resonance apparatus that has a controller designed to perform the method described above. The controller is formed, for instance, by a control computer such as a console of the magnetic resonance apparatus for example, but can also be implemented in any other computer. The controller has a processor, a data memory and preferably an input interface and output interface for the user, for instance keyboard, mouse, touchpad and/or screen. The digital pre-emphasis filter is preferably implemented likewise as a part of the controller.

The aforementioned method can be implemented in the controller as software or even as (hard-wired) hardware. The method is preferably performed in a method for acquiring raw MR data that are then transferred into an image dataset, which is made available from the controller from the control computer in electronic form for archiving or for display as an image.

The present invention also encompasses a non-transitory, computer-readable data storage medium encoded with programming instructions (program code) that, when the storage medium is loaded into a computer or computer system or controller of a magnetic resonance apparatus, cause the computer or computer system or controller to operate the magnetic resonance apparatus so as to implement any or all embodiments of the method according to the invention as described above.

DESCRIPTION OF THE PREFERRED EMBODIMENTS

Figure 1:
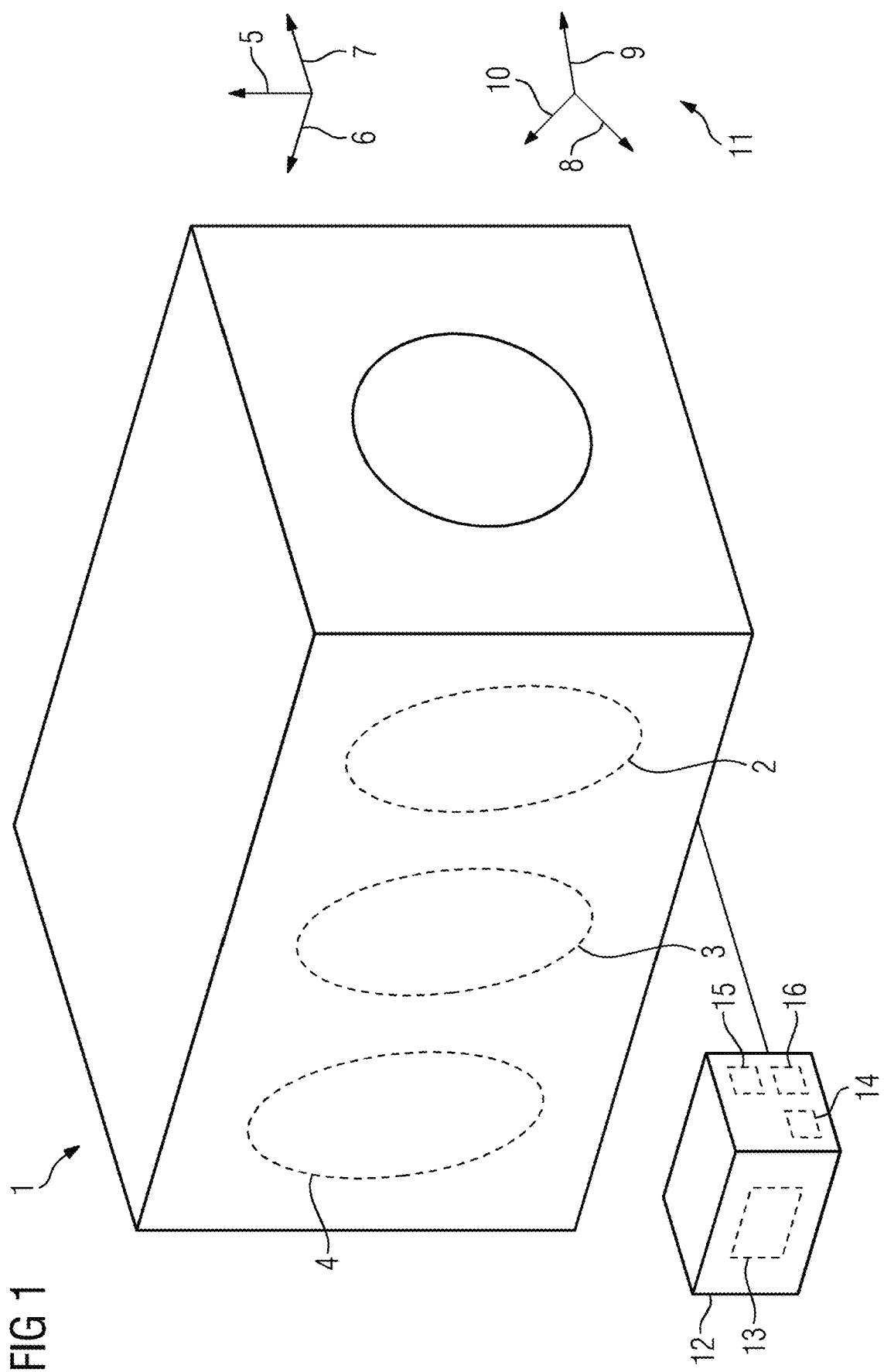
FIG. 1 schematically illustrates a scanner of a magnetic resonance apparatus that is operable in accordance with the invention.

FIG. 1 shows a magnetic resonance scanner 1 of a magnetic resonance apparatus. This scanner 1 has three gradient coils 2, 3 and 4. The gradient coils 2, 3 and 4 produce a gradient field in the x-direction, y-direction and z-direction respectively. In the axis representation shown here, the axis 6 is the z-axis, the axis 5 is the x-axis and the axis 7 is the y-axis.

In order to produce gradient fields in the readout direction 8, the phase direction 9 and the slice direction 10, the gradient fields produced by the gradient coils 2, 3 and 4 are superimposed in order to be able to rotate the effective gradient fields into any spatial directions. If the slice direction 10 lies in the direction of the axis 5, then one coil, e.g. the coil 2, is sufficient to produce the gradient field in the slice-selection direction. If, however, the slice direction points as in the axis field 11, the required gradient field is obtained by a combination of gradient fields produced by two or three of the gradient coils 2, 3 and 4.

Thus, for most measurements, multiple gradient coils 2, 3 and 4 are always energized, even if only one gradient pulse is shown in the sequence diagram.

The magnetic resonance scanner 1 has a controller 12 for control purposes. This controller 12, in addition to a memory 13 into which a data storage medium can be loaded has a control processor 14, and an adaptation processor 15 that adapts or converts magnetic resonance sequences 16 stored on the memory 13. The magnetic resonance apparatus can be controlled via a display device and an input device.

The control processor 14 and the adaptation processor 15 are preferably operated by software programs that can be loaded into the memory 13 of the controller 12 and used.

Figure 2:
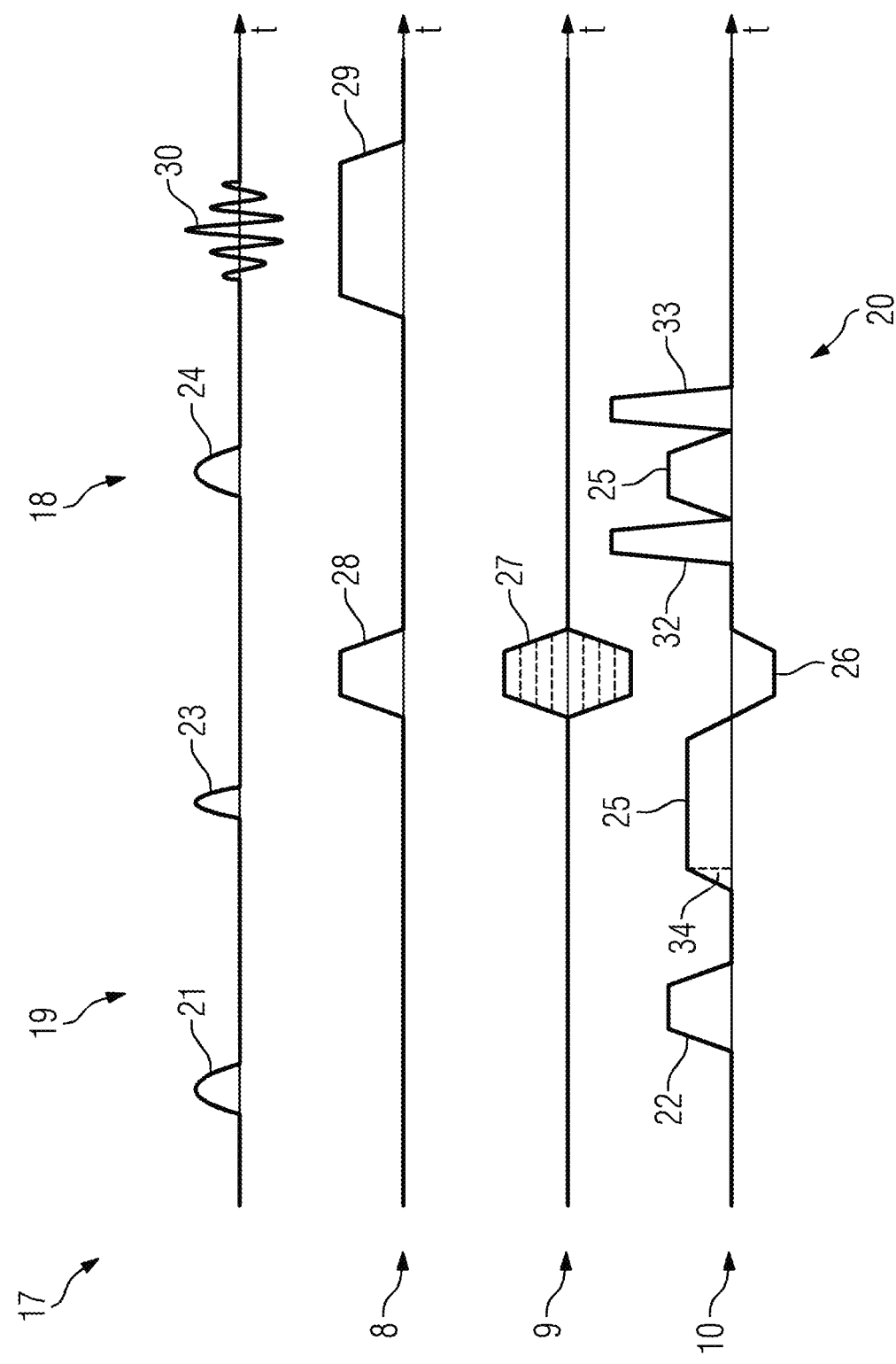
FIG. 2 shows a magnetic resonance sequence in a first embodiment of the invention.

FIG. 2 shows a sequence diagram 17 of an unoptimized magnetic resonance sequence 16, and specifically a spin echo sequence 18 having a preceding saturation module 19 and an internal spoiler unit 20. The RF pulses are shown in the top time axis, and underneath the gradient pulses in the readout direction 8, phase direction 9 and slice direction 10.

The saturation module 19 includes a saturation pulse 21 and a spoiler gradient 22. This is shown solely as an example in the slice direction 10 in the figure, although further spoiler gradients can also be used in the readout direction 8 or the phase direction 9. As is well known, the spin echo sequence 18 has a 90° excitation pulse 23, a refocusing pulse 24, a slice-selection gradient 25, a slice-rephasing gradient 26, a phase gradient 27, a readout dephasing gradient 28 and a readout gradient 29. This produces an echo 30. In order to remove imperfections in the refocusing pulse 24, the spoiler unit 20 containing two spoiler gradients 32 and 33 is used. The second spoiler gradient 33 dephases all the signal that was not refocused by the refocusing pulse 24.

Figure 3:
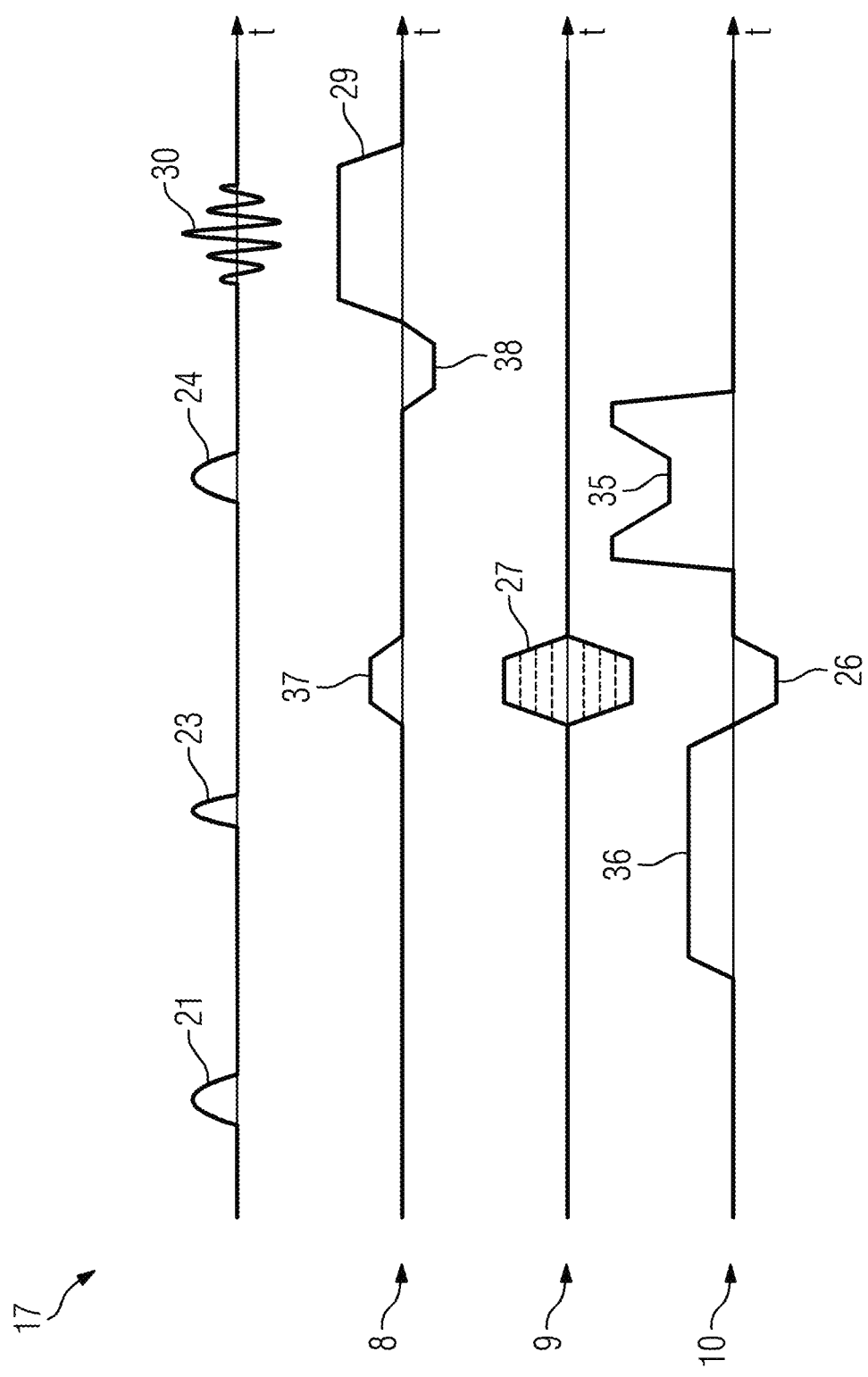
FIG. 3 shows a magnetic resonance sequence in a second embodiment of the invention.

FIG. 3 shows the result of a first method step for reducing gradient-based artifacts, namely the gradient optimization known from DE 10 2014 203 867 that takes into account the moments of the gradient pulses, in particular retaining the zeroth gradient moment. In the present example, for instance, the spoiler gradients 32 and 33 can be combined with the gradient ramps 34 to produce a combination gradient 35 in this step. The spoiler gradient 22 and the gradient ramp 34 before the slice-selection gradient 25 can also be combined to form a combination gradient 36. On the other hand, the readout dephasing gradient 28 can be divided into two sub-gradients 37 and 38 while maintaining the area under the gradient curves. These measures are intended in particular to reduce the slew rate and thus the noise produced.

Only the strength and duration of the slice-selection gradient 25 and of the readout gradient 29 are not allowed to be changed in order to keep the slice thickness and the resolution the same.

Figure 4:
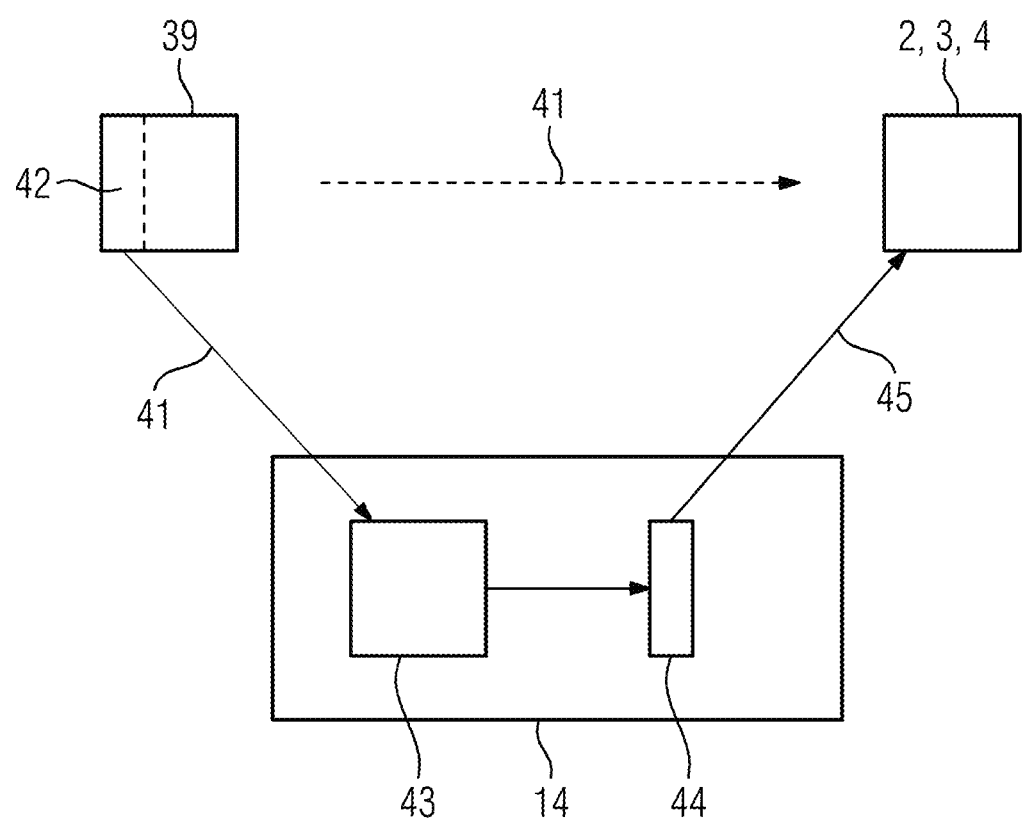
FIG. 4 is a flowchart for generating a pre-GIRF gradient signal.

FIG. 4 shows an example of the processing according to the invention of the gradient signals.

The controller 12 provides a magnetic resonance sequence 16 containing target gradient waveforms 39. The magnetic resonance sequence is adapted by the adaptation processor 15 and converted into an executable sequence execution signal including a target gradient signal 41. This is divided into individual event blocks 42, each of which are processed in feed-forward, i.e. feedback and subsequent modification of the sequence execution signal is no longer possible within an event block 42.

In the prior art, the target gradient signal 41 is used directly (dashed arrow) to control the gradient unit comprising the gradient coils 2, 3 and 4. In the invention, however, is now interposed at least the pre-emphasis filter 44, which is part of the control processor 14. In other words, the target gradient signal 41 is input in real time into the pre-emphasis filter 44, with the pre-emphasis filter 44 processing the event blocks 42 directly one after the other without a gap. In this process, the target gradient signal 41 is buffered over the length of the filter. One sample point of the pre-GIRF gradient signal 45 is output for each sample point of the target gradient signal 41 that is input, with the result that the delay equals substantially just the filter length, so preferably less than 10 ms.

Before the pre-emphasis filter 44, the target gradient signal 41 preferably undergoes the gradient optimization 43 known from DE 10 2014 203 867. This also happens "on the fly" with a delay lying in the region of milliseconds.

The pre-GIRF gradient signal 45 optimized in this way is transmitted to the gradient coils 2, 3, 4, where it produces the actual gradient waveforms. The actual gradient waveforms are closer to the target gradient waveforms then if the target gradient signal 41 were to have been used directly.

Figure 5:
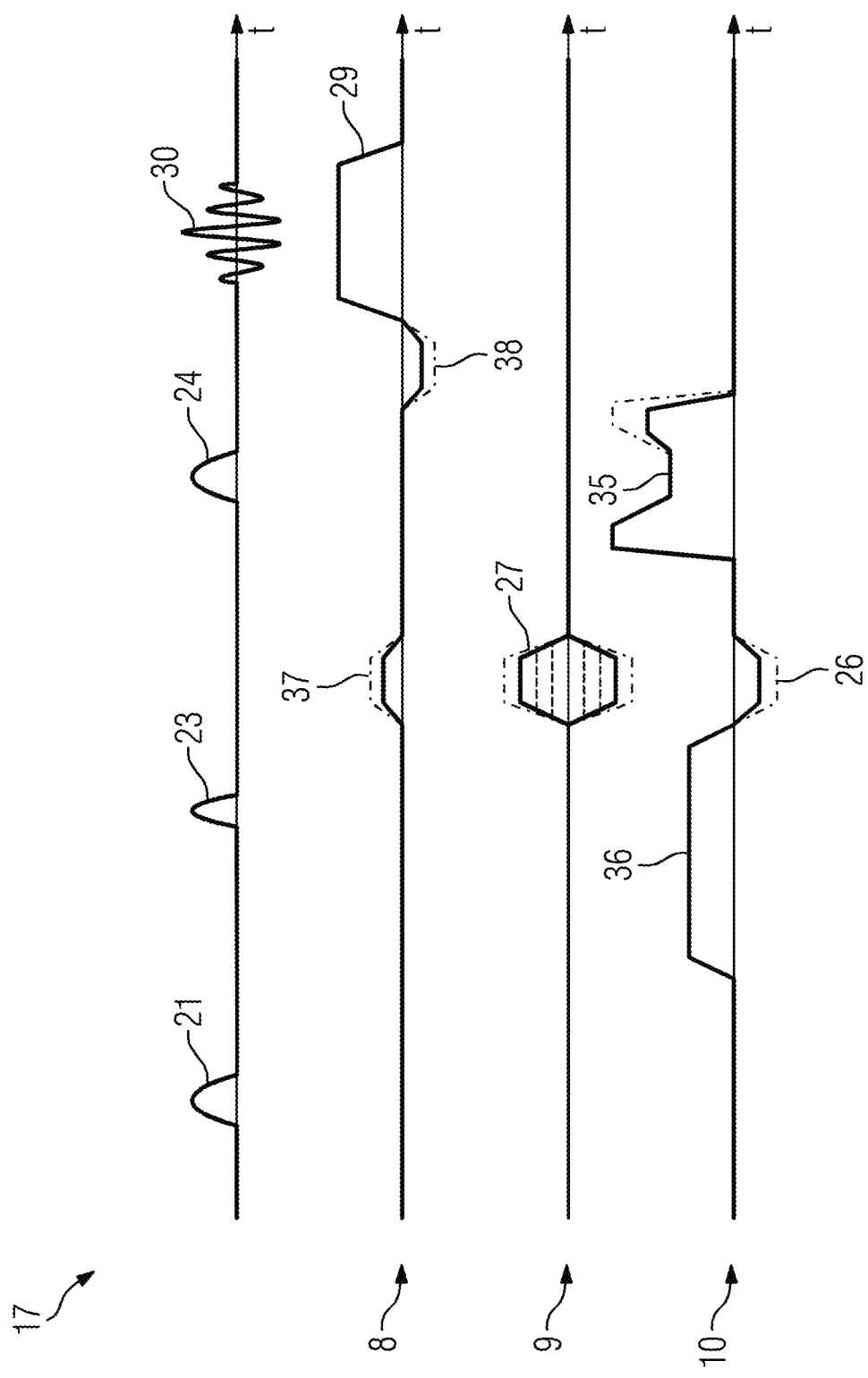
FIG. 5 shows a magnetic resonance sequence in a third embodiment of the invention

FIG. 5 shows a diagram of the resultant magnetic resonance sequence when using the control processor 14. The gradient currents have been modified in some places compared with FIG. 3, although the changes are shown schematically and only as an example. The dashed lines here show the original target gradient signals and the lines underneath show the pre-GIRF gradient signals.

Figure 6:
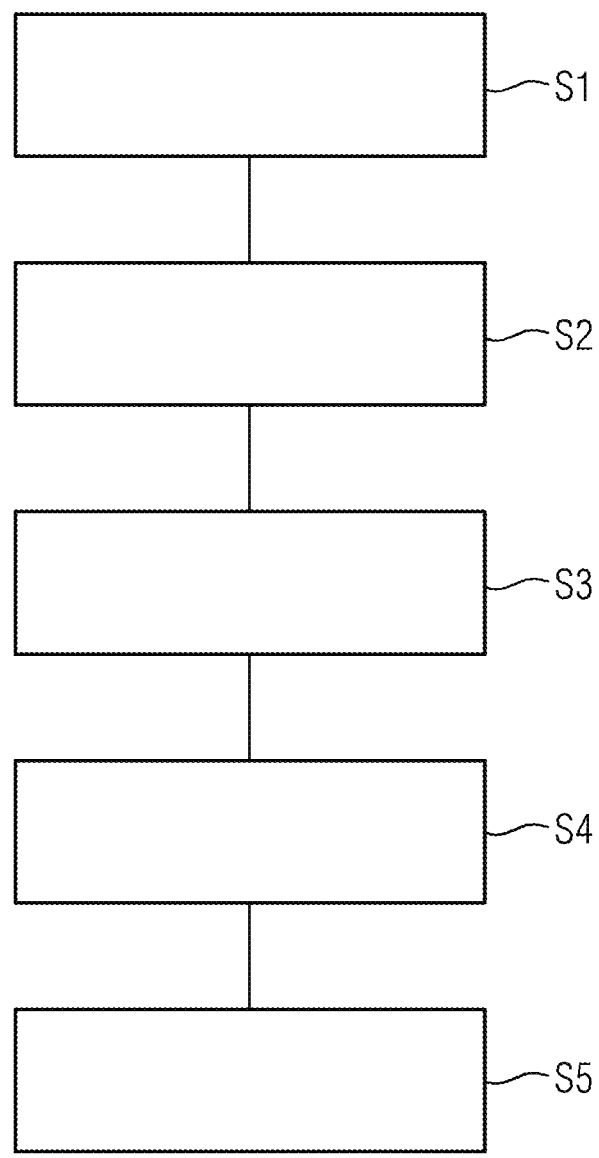
FIG. 6 is a flowchart for acquiring a magnetic resonance dataset in accordance with the invention.

FIG. 6 is a flowchart for acquiring a magnetic resonance dataset. In step S1, a magnetic resonance sequence 16 is provided. The parameters of the magnetic resonance sequence can be adapted by the adaptation processor 15. In this process, the resolution and position of the layers, the number of slices and other measurement parameters can be adjusted.

In step S2, an executable sequence execution signal, including a gradient control signal, the target gradient signal 41, is produced therefrom.

At the start of the measurement in step S3, the transfer of the target gradient signal 41 to the control processor 14 also starts.

In a preferred embodiment, the target gradient signal 41 is also gradient-optimized in step S3, in particular by smoothing some gradient pulses. In this process, as described above, the corners in particular are rounded off, thereby minimizing the noise reduction.

In step S4, the target gradient signal 41 optimized in this way is then fed into the digital pre-emphasis filter 44, event block by event block, and the filtered pre-GIRF gradient signal 45 is output again.

In step S5, the pre-GIRF gradient signal 45 processed in this way is passed to the magnetic resonance scanner 1 as part of the sequence execution signal, and is used to perform the magnetic resonance examination.

In this process, the controller 12 can respond in real time to events in the patient or results of the data analysis, i.e. the magnetic resonance sequence can be modified during the measurement, and future event blocks are again processed automatically by the pre-emphasis filter in the steps S2 to S4.

Thus the present invention presents a method and an algorithm for automatic correction of GIRF-induced gradient errors, which algorithm is designed such that the gradient waveform actually implemented at the scanner corresponds at least approximately to the target gradient waveform specified by the user. This is done by determining a "pre-GIRF gradient waveform" in an algorithm.

As described in more detail above, the method basically includes the controller 12:
1. Being provided with a first target sequence;
2. Creating a second sequence, which is designed such that after a system-specific impairment it corresponds to the first target sequence; and
3. Emitting and executing the second sequence.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) apparatus to acquire an MR dataset, said MR apparatus comprising a scanner having a gradient coil arrangement comprising multiple gradient coils that have gradient impulse response functions (GIRFs) associated therewith, said method comprising:
   using, via a computer, a MR sequence to operate the scanner to acquire the MR dataset by:
      via the computer, converting the MR sequence into a digital sequence execution signal that comprises a target gradient waveform configured as a time-discrete target gradient signal;
      via said computer, calculating a pre-GIRF gradient signal by applying a digital pre-emphasis filter to the target gradient signal;
      transmitting the pre-GIRF gradient signal to the scanner in said digital sequence execution signal, and employing, as said digital pre-emphasis filter, a digital pre-emphasis filter for each individual value of said pre-GIRF gradient signal that requires a processing time that is shorter by a predetermined factor than a time resolution of said target gradient signal
      operating the scanner with the digital sequence execution signal that contains the pre-GIRF gradient signal to acquire said MR dataset, and making the acquired MR dataset available in electronic form from the computer as a data file.

2. A method as claimed in claim 1, comprising:
   pre-emphasizing said pre-GIRF gradient signal by applying said digital pre-emphasis filter to said target gradient signal so that a waveform generated by the scanner during acquisition of said MR dataset is closer to said target gradient waveform than the target gradient signal.

3. A method as claimed in claim 1, comprising:
   pre-emphasizing said pre-GIRF gradient signal by applying said digital pre-emphasis filter to said target gradient signal to at least partially correct the gradient impulse response functions.

4. A method as claimed in claim 1, comprising:
applying the digital pre-emphasis filter to the target gradient signal in the time domain.

5. A method as claimed in claim 1, comprising:
applying the digital pre-emphasis filter to the target gradient signal during acquisition of said MR dataset to respective time windows of the target gradient signal in which MR data are acquired, said time windows being of a predetermined length.

6. A method as claimed in claim 1, comprising:
selecting a predetermined length for at least one time window associated with the digital pre-emphasis filter from the group consisting of a length between 0.2 and 10 ms, and a length between 0.8 and 5 ms.

7. A method as claimed in claim 1, wherein said predetermined factor is in a range between 5 and 10.

8. A method as claimed in claim 1, comprising:
via said computer, buffering said target gradient signal in a rolling manner in a buffer before or while applying said digital pre-emphasis filter.

9. A method as claimed in claim 8, wherein said MR sequence comprises at least two event blocks, and comprising:
during conversion of said MR sequence into a digital sequence execution signal, processing one event block after another and passing contents of the buffer to a next event block at an end of processing of each preceding event block to calculate the pre-GIRF gradient signal.

10. A method as claimed in claim 1, wherein said MR sequence is a real-time sequence, and comprising:
adapting said MR sequence during acquisition of said MR dataset.

11. A method as claimed in claim 10, comprising:
adapting said real-time MR sequence to movement of a patient during the acquisition of said MR dataset.

12. A method as claimed in claim 1, comprising:
generating, in a gradient optimization filter in said computer, at least one gradient pulse of the target gradient signal or of the pre-GIRF gradient signal to achieve at least one of a reduction of demands on the gradient coil arrangement, an acceleration of an acquisition of said MR dataset, and a reduction of noise produced by said scanner during acquisition of said MR dataset.

13. A method as claimed in claim 12, comprising:
generating at least one gradient pulse with said gradient optimization filter dependent on at least a first gradient moment of the gradient pulse.

14. A method as claimed in claim 13, comprising:
maintaining a zeroth gradient moment of the gradient pulse constant while optimizing said first gradient moment of the gradient pulse.

15. A method as claimed in claim 13, comprising:
harmonizing said gradient optimization filter and said digital pre-emphasis filter by configuring the gradient optimization filter dependent on a factor associated with GIRFs that are specific to said scanner and obtained during configuration of said digital pre-emphasis filter.

16. A method as claimed in claim 15, wherein said factor is present in frequencies that are specific to said scanner.

17. A magnetic resonance (MR) apparatus, comprising:
a data acquisition scanner having a gradient coil arrangement comprising multiple gradient coils that have gradient impulse response functions (GIRFs) associated therewith;
a computer configured to:
use a MR sequence to operate the scanner to acquire an MR dataset by:
converting the MR sequence into a digital sequence execution signal that comprises a target gradient waveform configured as a time-discrete target gradient signal;
calculating a pre-GIRF gradient signal by applying a digital pre-emphasis filter to the target gradient signal, and employing, as said digital pre-emphasis filter, a digital pre-emphasis filter for each individual value of said pre-GIRF gradient signal that requires a processing time that is shorter by a predetermined factor than a time resolution of said target gradient signal;
transmitting the pre-GIRF gradient signal to the scanner in said digital sequence execution signal; and
operating the scanner with the digital sequence execution signal that contains the pre-GIRF gradient signal to acquire said MR dataset, and to make the acquired MR dataset available in electronic form from the computer as a data file.

18. A non-transitory, computer-readable data storage medium encoded with programming instructions for operating a magnetic resonance (MR) apparatus to acquire an MR dataset, said MR apparatus comprising a scanner having a gradient coil arrangement comprising multiple gradient coils that have gradient impulse response functions (GIRFs) associated therewith, said storage medium being loaded into a computer of the MR apparatus and said programming instructions causing said computer system to:
receive a MR sequence and use the MR sequence to operate the scanner to acquire the MR dataset by:
converting the MR sequence into a digital sequence execution signal that comprises a target gradient waveform configured as a time-discrete target gradient signal;
calculating a pre-GIRF gradient signal by applying a digital pre-emphasis filter to the target gradient signal, and employing, as said digital pre-emphasis filter, a digital pre-emphasis filter for each individual value of said pre-GIRF gradient signal that requires a processing time that is shorter by a predetermined factor than a time resolution of said target gradient signal;
transmitting the pre-GIRF gradient signal to the scanner in said digital sequence execution signal; and
operating the scanner with the digital sequence execution signal that contains the pre-GIRF gradient signal in order to acquire said MR dataset, and make the acquired MR dataset available in electronic form from the computer as a data file.

19. The method as claimed in claim 1, wherein the magnetic resonance sequence, which is used to acquire the MR dataset, defines a succession of radio-frequency pulses and gradient pulses along different gradient axes in different spatial directions such that the gradient pulses are emitted in coordination with the radio-frequency pulses.

\* \* \* \* \*